United States Patent
Berkely et al.

[19]

[11] Patent Number: 6,091,146

[45] Date of Patent: Jul. 18, 2000

[54] CERAMIC LID FOR LARGE MULTI-CHIP MODULES

[75] Inventors: Ryan S. Berkely, Long Beach; Steven Park, San Pedro; Mary C. Massey, Manhattan Beach; Steven F. VanLiew, El Segundo, all of Calif.

[73] Assignee: TRW Inc., Redondo Beach, Calif.

[21] Appl. No.: 08/987,859

[22] Filed: Dec. 9, 1997

[51] Int. Cl.$^7$ ................................. H01L 23/04
[52] U.S. Cl. ................ 257/730; 257/678; 257/704; 257/705; 257/710; 257/731
[58] Field of Search .................. 257/704, 710, 257/730, 732, 731, 678, 705

[56] References Cited

U.S. PATENT DOCUMENTS

| | | | |
|---|---|---|---|
| 3,538,597 | 11/1970 | Leinkram et al. | 29/588 |
| 4,356,047 | 10/1982 | Gordon et al. | 156/89 |
| 4,750,665 | 6/1988 | Falanga | 228/123 |
| 4,769,272 | 9/1988 | Byrne et al. | 428/209 |
| 4,833,102 | 5/1989 | Byrne et al. | 257/704 |
| 4,975,762 | 12/1990 | Sradley et al. | 357/74 |
| 5,477,009 | 12/1995 | Brendecke et al. | 257/704 |
| 5,498,900 | 3/1996 | Denaway et al. | 257/659 |

FOREIGN PATENT DOCUMENTS 3-936613  5/1991  Germany .
5-267485  10/1993  Japan .

OTHER PUBLICATIONS

"Lid Deflection for MCM,s in Airborne Application" ICEMCM 96 Proceedings of the 1996 EHM Conference on Multicip Modules, pp. 167–172, Apr. 7, 1996.

*Primary Examiner*—Olik Chaudhuri
*Assistant Examiner*—Alonzo Chambliss
*Attorney, Agent, or Firm*—Michael S. Yatsko; Ronald M. Goldman

[57] ABSTRACT

A reworkable multi-chip module contains a large multi-chip module package (2) with an opening at the top to permit access to an internal region for semiconductor devices, the opening being at least four square inches area with the length or width dimension being at least two inches. The opening is sealed with a stiff closure (1) of sufficient rigidity to withstand at least one atmosphere of differential pressure without significant deflection, is removable in a single piece and may be reinstalled. The closure includes a panel of electrically non-conductive material (3) and a metal flange (5) borders the periphery of the panel to support the panel on the top of the module package.

9 Claims, 4 Drawing Sheets

CERAMIC LID FOR LARGE MULTI-CHIP MODULES

FIELD OF THE INVENTION

This invention relates to large hermetically sealed electronic packages and, more particularly, to an improved lid construction for such packages.

BACKGROUND

Two or more semiconductor chips and associated circuits may be assembled together in a single package, referred to as a hybrid or multi-chip module (MCM). The package serves as a protective container for the semiconductor chips, ancillary electrical components, and associated electronic circuits, that are typically supported on a common base. The base generally supports, or consists directly of, a printed circuit element which includes the electrical interconnection paths for the various components and associated connections to the outside of the package.

In order to provide an hermetic seal for the package a lid is generally attached by an appropriate metallurgical bond around the perimeter such that the various components are enclosed within. A seal ring is typically incorporated in the package base to facilitate forming the metallugical bond to the lid. This seal ring may take various forms such as metal side walls on a metal package, a metallized ring surrounding the enclosed component area on a ceramic package, or a separate raised metal ring metallurgically bonded to a ceramic package.

A desirable feature of MCM packages is that they be "reworkable", in the event one or more of the semiconductor devices in the MCM fail, and require replacement. Whereas an individually packaged semiconductor chip cannot be repaired and can simply be discarded if it fails, it is not economical to discard an entire MCM if one of its many semiconductor chips fails. Thus it is desirable that the package be sealed in such a manner that it is possible to remove the lid, remove and replace the failed device(s), and thereafter replace the lid and reseal the package.

In certain instances benefits such as size, weight, and power reductions, and improved electrical performance may be realized by increasing the overall size of MCM packages to envelope more circuit elements that would otherwise be in separate packages. As the length or width dimensions of the associated large MCM lids are driven beyond about 2 inches, forces on the lids can become problematic.

Significant forces on large hermetic MCM lids arise as a result of differential pressure between the inside and outside of the package. This occurs during post-seal leak testing when an external overpressure is used to drive a detectable leak tagging gas into the package and later when high altitude or space applications reduce the external ambient pressure to levels far below the gas pressure entrapped in the enclosed package.

The effect of these large forces is a tendency for the lid to deflect inward, possibly contacting and damaging enclosed components, or outward where undesireable contact with structure or other parts located in close proximity may occur. In addition to the possibility of undesireable contact, the deflection creates large forces on the metallurgical bond between the lid and seal ring, enough to exceed elastic stress limits, with an associated tendency to lose hermeticity.

It may be shown by approximating a section of the lid with beam equations that lid deflection is proportional to $PL^4/t^3$, where P is differential pressure, L is the unsupported beam length, and t is the beam thickness. From this it may be appreciated that lid deflection for a 2.5 inch span is approximately 2.6 times that of a 2.0 inch span. It may also be recognized that to minimize deflection simply by increasing lid thickness, the lid thickness must increase geometrically relative to the increase in span. For large MCMs, this leads to prohibitively heavy lids, especially for avionics and spacecraft applications.

Other solutions have been offered to protect internal components from inward deflection, and the seal from large stresses, but each solution poses an offsetting disadvantage. Internal support posts or other intermediate internal supports require space within the package impacting the area available for component placement and routing.

Others have recently identified and publicized the foregoing problems in an article entitled "Lid Deflection for MCMs in Airborne Application, Huey et al., ICEMCM '96 Proceedings of the 1996 EHM Conference on Multichip Modules, Apr. 7, 1996, pp. 167–172, which the reader is invited to review. In that article, the authors recognize the foregoing solutions and explore the disadvantages of those solutions at greater length than here. The solution the article's authors think best is to hermetically seal the MCM at a lower gas pressure of one-half atmosphere, instead of the normal one atmosphere pressure. The present invention also seeks to ensure continued integrity of the lid in such high pressure differential situations and offers a different and better solution than proposed in that article.

With hindsight, one seeking cure to the pressure differential based deflection problem might first briefly think to make reference for same to the individual semiconductor packaging art, that is, the packaging semiconductors individually, and quickly dismiss the thought.

As is well recognized, a semiconductor chip is a physically small device, perhaps no greater in size than one-quarter to one-half inch square. One such package is known as the ceramic side brazed dual in-line package. The package, that is the base, is formed of ceramic material, is of rectangular shape, a Kovar™ metal seal ring forms a rectangular wall of short height on the base enclosing the semiconductor, and two rows of metal pins are brazed to the edges of the base, providing terminals for connection to other electrical circuits. The semiconductor device is installed in the package. And means are provided for connection the semiconductor device bonding pads to metal pathways incorporated into the package that connect to the metal pins. The semiconductor package is also hermetically sealed by welding or soldering a closure lid atop the seal ring. The closure lids for those packages are formed either of a compatible metal such as Kovar™, or of the same ceramic material that forms the package. Thus the smaller individual chips are recognized to share a generic similarity with the physically larger MCMs.

The reader is reminded that, notwithstanding the fact that the package seal ring and/or lid is formed of a metal alloy, MCM individual chip packages are generally referred to by technicians in the industry as ceramic packages, however imprecise that reference may be, so long as the package contains a base that is formed of ceramic material.

In looking to the individual chip packaging art, however, one is quickly reminded that reworkability is not a requirement for those semiconductor packages as it is for MCM. The devices cannot be reworked. If a semiconductor chip fails to perform, it is simply discarded and replaced by a like component. If it fails in operation in a circuit, the package is unsoldered from its place on the printed circuit board and is replaced with another like chip.

As stated by Byrne in U.S. Pat. No. 4,769,272, a patent that describes a ceramic package for an individual chip, and alluded to in his divisional patent U.S. Pat. No. 4,833,102, metal lids, such as nickel/iron alloy lids, can be "popped off" a ceramic package, viewed in the single chip package art as a disadvantage, but the ceramic lids cannot. To effect removal of a sealed ceramic lid, according to Byrne, the lid ordinarily must be fractured and removed in pieces. Hence, putting higher cost of the ceramic aside, the ceramic lid is believed more reliable than the Kovar™ for packaging individual semiconductor chips because it is permanent and cannot be reworked.

Were the lack of reworkability taught by Bryne not discouragement enough, one also finds that no one in that art appears to address a problem of excess lid deflection. As example, faced with manufacturing difficulties of high volume production, in U.S. Pat. No. 4,356,047, Gordon finds that bare wires used to bond the connection sites of a semiconductor chip to the circuit board in an individual chip package, could contact the gold plating on the Kovar™ lid, if misrouted during assembly, and short-circuit the chip, which must be discarded, thereby lowering production yield. Gordon proposes use of ceramic, a non-conductor, for the lid material and solders the ceramic lid to the seal ring.

Further, in U.S. Pat. No. 4,750,665, Falanga finds that a Kovar™ lid corrodes when exposed to salt air or other corrosive atmosphere and substitutes a ceramic sheet supported by a solder wettable metal frame that is soldered to the package's seal ring.

Then, Stradley U.S. Pat. No. 4,975,762 who employs a ceramic lid for an individual chip package, as suggested by Gordon, but incurs problems due to the existence of alpha particles generated naturally by Thorium and/or Uranium impurities within the ceramic used. The alpha particles could shower the semiconductor and cause mis-operation, referred to as "soft errors". To prevent that Gordon requires the addition of an alpha particle blocking layer to the ceramic. Stradley suggests that the cure to one problem often engenders other problems.

And then, in U.S. Pat. No. 5,495,900, Dunaway, who exposes his packaged chips to high energy particles, such as X-radiation, finds gold plated Kovar™ lids liberate and shower the packaged semiconductor chip with electrons, and that those X-rays can produce thermal mechanical shock of the solder bonding the ceramic lids in the package. To avoid that damage Dunaway substitutes a metal framed ceramic sheet for the Kovar™ lid, and connects the sheet to the frame and the frame to the seal ring with a solder free welded bond.

The prior art reviewed in hindsight addresses a litany of problems, but none appear to address a problem with excess lid deflection.

As a lay person recognizes from experience, pushing down on the middle of a metal soda pop bottle cap, while the cap is in place on the bottle, produces indiscernible deflection of the cap's surface. But, pushing down on the middle of the lid of a can of tomato's with the same force, produces discernable deflection, even though the thickness of the can's lid is greater than that of the corresponding surface of the bottle cap. The diameter of the tomato can lid being much larger, because of the greater distance of the pressing force to the supporting edges, one obtains a greater mechanical advantage and pushing down on the tomato can's lid thereby produces deflection.

Experience teaches that it is not worthwhile to try to deflect the bottle cap surface and any thought of attempting to do so no longer comes to mind. But the tomato can sometimes becomes a sort of toy noisemaker, sometimes producing a popping sound that gives momentary amusement. Those skilled in the art will recognize the same distinction between the small sized lids used in packages for individual semiconductors and the much larger lids required for large multi-chip modules, those having length or width greater than about 2 inches. The lack of relevance of the individual chip packaging structures to the deflection problem is clear. One having the deflection problem with MCM package lids, is thereby led to continue research to uncover a solution.

Accordingly, an object of the present invention is to provide a lid for large MCM's that does not significantly deflect when subjected to large differential pressures.

Another object of the invention is to provide a new lid for a MCM package that does not require a change in the physical dimensions of the MCM package and/or the addition of stiffening posts to avoid excessive lid deflection when the MCM package is subjected to large stresses created by large pressure differentials existing between the gas atmosphere internal of the package and that on the exterior.

A further object of the invention is to provide an improved multi-chip module package that withstands large pressure differentials without encountering significant elastic lid deformation and which is reworkable.

SUMMARY OF THE INVENTION

A physical characteristic of alumina, not expressed by the referenced literature but perhaps implicit in actual individual chip packages, is that as a solid body, alumina is extremely rigid; about five times as rigid as Kovar™ per unit weight. As applicants have discovered, slabs of Alumina of the large areas required for large MCM's, two inches and larger in dimension, do not bend or deflect excessively when subjected to large pressure differentials. Any deflection is minimal.

Accordingly, in accordance with the foregoing objects, a lid for an MCM package is formed principally of alumina in a size of four square inches or larger and in a thickness of 0.04 inches. The lid includes a stepped rim formed of Kovar™ that is brazed to the alumina with a copper-silver braze material. The foregoing lid takes advantage of existing MCM package base designs and permits the lid to be welded to the base by traditional methods, allowing the package to be re-worked.

The new lid has significantly less deflection. It is relatively simple to manufacture. Given the advantage of hindsight and in retrospect, the foregoing improvement in MCM packaging with its new lid structure bares likeness to the alternative lid structures employed for some individual chip packages with which the new lid might in retrospect be compared, and comes about for a reason entirely different from that underlying use in the individual chip packages.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

DETAILED DESCRIPTION OF A PREFERRED EMBODIMENT

Figure 1:
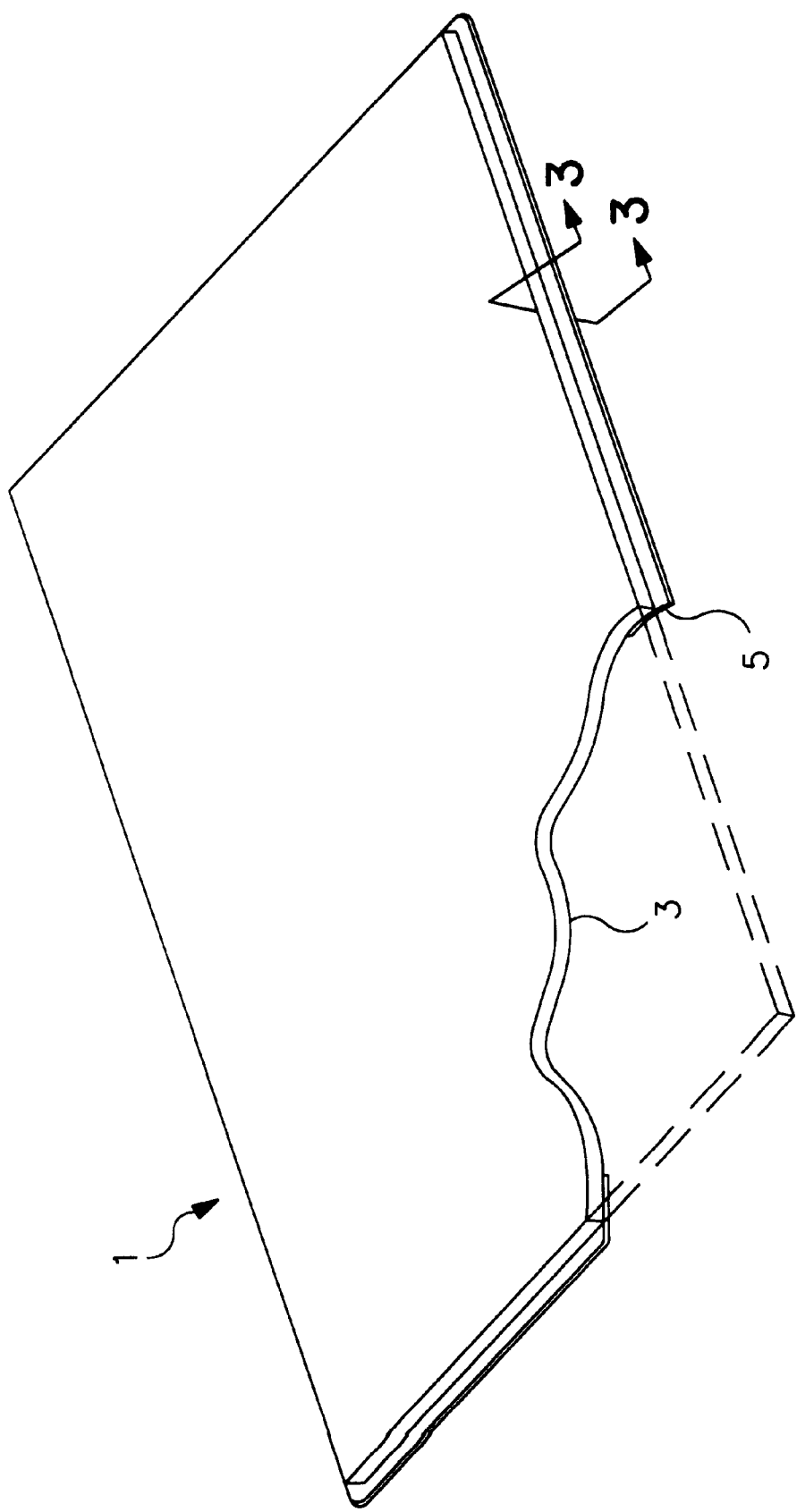
FIG. 1 illustrates an embodiment of the MCM lid.

A lid 1 constructed in accordance with the invention is illustrated in a partial top perspective view in FIG. 1, with one of the corners, represented by dash lines, being cut away for purposes of illustration. Lid 1 is constructed of a thin flat rectangular sheet 3 of aluminum oxide, alumina, an electrical ceramic insulator that in physical characteristic is very hard, relatively lightweight and stiff. Alumina sheet 3 overlies and is attached along its outer edges to a stepped rectangular shaped metal frame 5, that is formed of a nickel-iron alloy such as Kovar™, and may be plated with nickel and/or gold. As illustrated, the metal frame is slightly greater in its length and width dimensions than the alumina sheet so as to protrude beyond the flat sheet's edges on all four sides, and the frame's width is sufficiently large so as to allow a portion of the frame's rim to overlap the underside edges of alumina sheet 3 and provide the latter support, while providing a large central open area or window.

Figure 2:
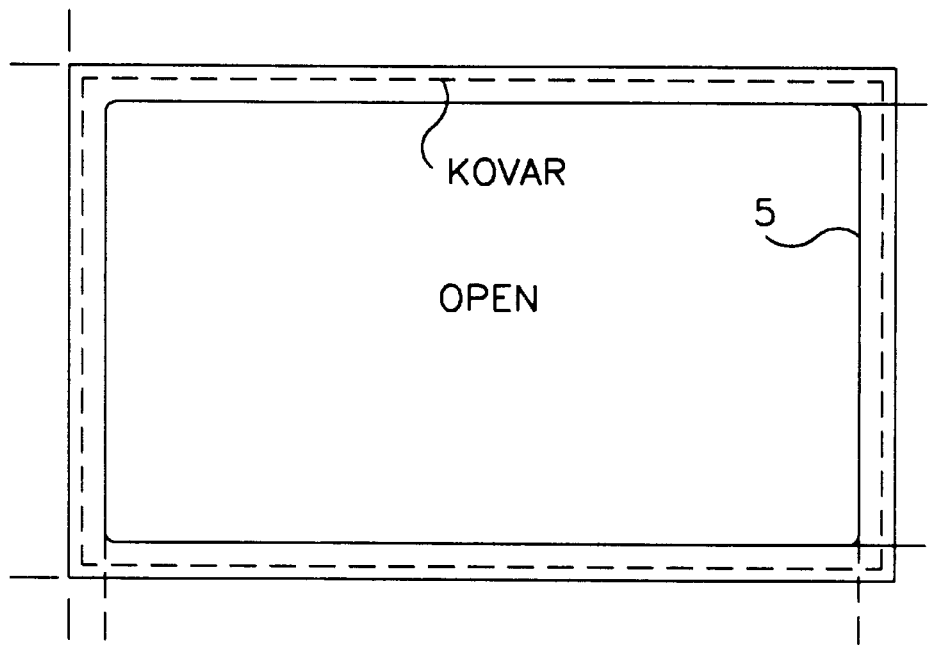
FIG. 2 illustrates a top plan view of the frame for the lid of FIG. 1.

A separate top plan view of frame 5 is illustrated in FIG. 2. The dash line in that figure is included to indicate the position of the outermost edges of the alumina sheet 3 overlapped by the frame.

Figure 3:
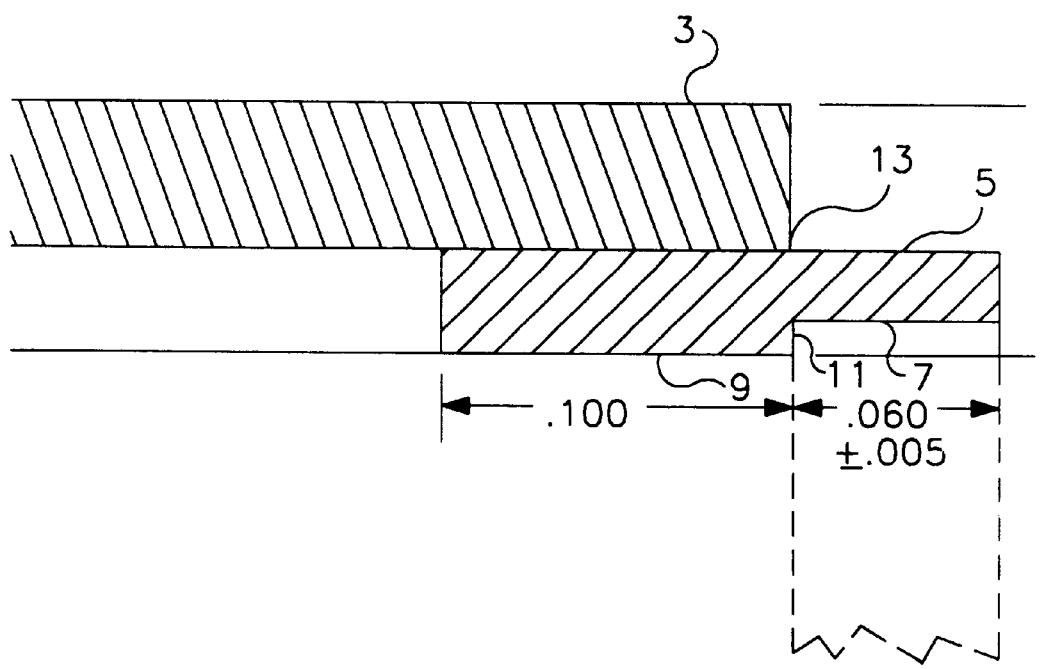
FIG. 3 is a partial section view of a side edge of the lid of FIG. 1.

An enlarged partial cross section view of the lid, taken along the lines 3—3 in FIG. 1, is illustrated in greater scale in FIG. 3 to which reference is made. As more clearly shown in this figure the underside surface of the frame is stepped. A portion of the frame's bottom surface 7 is stepped up or recessed from the remaining bottom surface portion 9, with a vertical "riser" surface 11 between the two surface portions.

Figure 4:
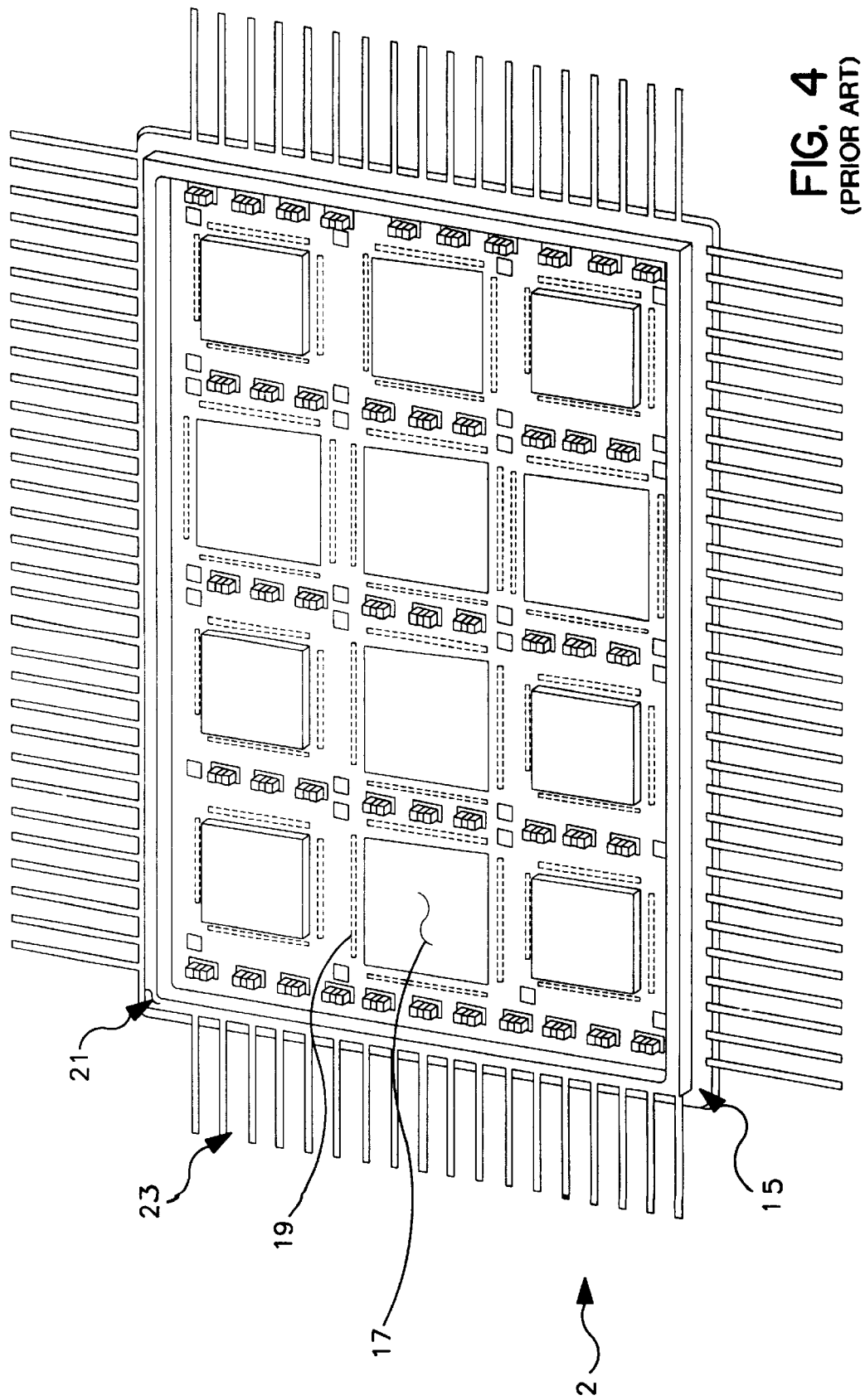
FIG. 4 illustrates a prior art MCM package base elements used with the lid of FIG. 1 to form the package for the MCM.

The width of stepped portion 7 is designed to fit the width of the top of the upstanding ring frame of the MCM package, the latter illustrated by dash lines, and such as illustrated in FIG. 4, later herein described. The riser helps to align the lid to that package side wall and allows the lid to be more easily set in place. The upper inner surface peripherally bordering frame 5 serves as an upper flange and supports sheet 3 along its bottom peripheral edges. Frame 5 is attached to alumina sheet 3, preferably, using a copper-silver or similar braze material 13.

FIG. 4 illustrates a Multi-Chip Module package 2 in a top perspective view with the lid 1 of FIG. 1 removed. It represents the portion of the MCM package that is the same as found in the prior art. The figure is not drawn to scale, the circuit elements are presented to show positioning and mechanical configuration principally of the packaging elements and the relationship of the elements to lid 1. It is appreciated further that the elements on the MCM in FIG. 4 are not intended to represent any specific electronic device.

As an example of one common type of MCM package construction, the package's base 15 is formed of multi-layer ceramic and comprises a flat multilayer ceramic printed circuit board. The base supports two or more semiconductor chips 17 on its upper surface, twelve chips being illustrated, as well as plated on pattern of electrical conductors 19. A shallow upwardly extending rectangular shaped metal wall 21, formed of Kovar™, in the geometry of a rectangle or closed loop, referred to as a seal ring, is hermetically sealed to and permanently attached to base 15, suitably being brazed in place using conventional brazing material and technique to form a hermetic seal.

The Kovar™ seal ring surrounds the semiconductors and related electronic components of the electronic circuit disposed in the module and generally defines the height of a well or receptacle region for those electronic elements, which, ultimately, are hermetically sealed with lid 1 in place atop the Kovar™ seal ring. Further, the Kovar™ seal ring is slightly shorter in length and width dimension than the corresponding dimensions of base 15 and thereby proscribes a predefined smaller area of the larger sized area of the base, leaving exposed edges exterior of the wall on all four sides of the base to which parallel rows of straight metal conductors or terminals 23 are attached.

Figure 5:
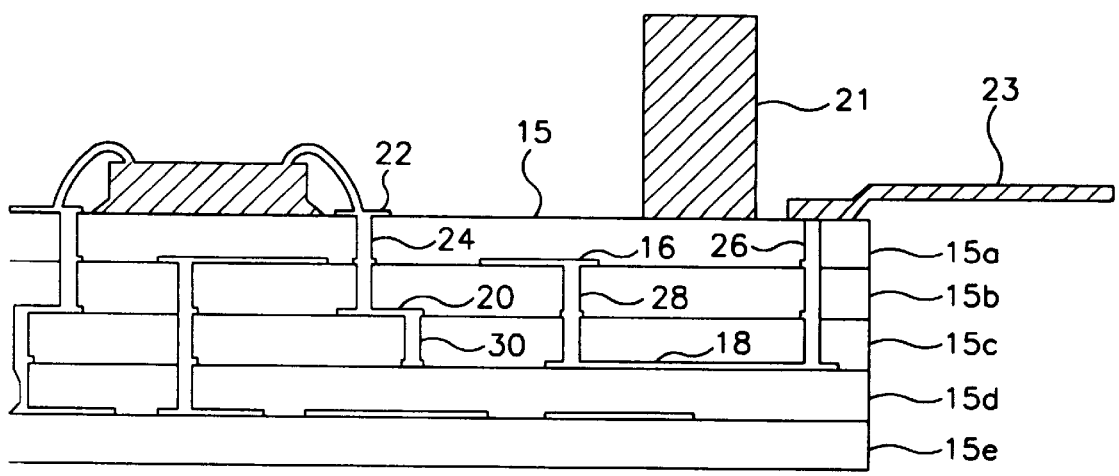
FIG. 5 is an enlarged not-to-scale partial section view of a portion of the prior art elements of FIG. 4.

The semiconductor chips are epoxied or soldered to the ceramic substrate/base. Some of these bonding pads connect to electrical "vias" in the ceramic printed circuit board, which, as is known, are conductors that extend vertically, along the bases height direction. The via element is better represented in FIG. 5 to which reference is made. As illustrated by a greatly enlarged partial section view of a portion of a multilayer circuit board and by way of example, the ceramic printed circuit board 15 is formed of multiple layers bonded together, 15a–15e, five being illustrated. Some or all of those layers may contain patterns of electrical conductors, such as represented, as example at 16, 18, 20 and 22. They also contain vias, as example 24, 26, 28 and 30, the vertically extending conductors "solid-filled" holes through the layer, which interconnect the patterns on one surface with that on another, as example, to form a completed electronic circuit.

As example in this figure vias 24, comprising two vertically aligned vias on separate layer levels, connect a bonding pad 22 on the surface to other electrical circuits on the board and/or connect to a bonding pad at one of the terminals 23 that is located outside the Kovar™ seal ring 21. This also illustrates the path taken to connect the internal circuits to the external terminal 23, as example, via circuit 16, via 28, circuit 18 and via 26, which defines a path under the Kovar™ side wall 21 to a bonding pad. Electrical terminal 23 is welded to the latter bonding pad.

Returning to FIG. 4, to complete the MCM, lid 1 is set in place on top of Kovar™ seal ring 21 and the peripheral edge of the protruding portion of frame 5 and its bottom surface portion 7 are metallurigically joined to the ring seal. This hermetically seals the package. In its application, the MCM is disposed within another printed circuit board, a mother board, not illustrated, which may also contain one or more additional components, and the external leads or terminals 23 interconnect to corresponding leads on that mother board to complete the desired electrical circuit.

Hermetic lids for large MCM's for avionics or spacecraft application require special design considerations relating to differential pressure: External overpressure during preconditioning for leak testing, and reduced external pressure at high altitude or in space. Under either of such differential pressures, positive or negative, it is found that the new lid has minimum distortion and produces insignificant deflection.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. In combination with a multi-chip module package, said multi-chip module package including a metal ring seal, having a upper edge and defining a hermetically sealed region where at least area dimensions of said hermetically sealed region extend two inches in distance, and a plurality of semiconductor chips positioned within said region, a lid for closing said regions comprising:

a solid flat rectangular panel of alumina, said panel having a thickness and having upper and lower sides;

a metal flange having a thickness, said flange having upper and lower sides and having a peripheral edge surface on said upper side for framing and supporting said panel; and said peripheral edge surface on said upper side including a layer of brazing material for bonding said peripheral edge surface of said flange to a peripheral edge of said lower side of said panel;

said flange having a rim on said lower side for seating to said metal ring seal of said multi-chip module package.

2. A lid for a large size multi-chip module package, said large size multi-chip module package having an upstanding rectangular wall extending in a closed loop having a length and width dimension to define an exposed area within said closed loop and in which at least one of said length and width dimensions of said closed loop is at least two inches in length, comprising:

a thin rigid flat sheet of alumina; and a Kovar™ metal frame attached to said flat sheet to form therewith a Kovar™ metal framed flat sheet;

said Kovar™ metal frame including:

an inner peripherally extending edge portion for supporting said flat sheet about the periphery of said flat sheet to one side of said Kovar™ metal frame, said peripherally extending edge portion being bonded to said flat sheet by brazing material;

an outer peripherally extending flange portion extending about an outer peripheral edge portion for attaching engagement with said upstanding wall on an opposed side of said Kovar™ metal frame; and at least said outer peripherally extending flange portion further including a first plating layer of the metal nickel and a second plating layer, overlying said first plating layer, of the metal gold;

said Kovar™ metal framed flat sheet defining a surface area sufficient in size to cover said exposed area and being of sufficient rigidity to withstand a pressure differential between said one side and said opposed side of at least one atmosphere without significant surface deflection.

3. A lid for a reworkable multi-chip module package, said multi-chip module package defining a semiconductor chip confinement area of at least four square inches in area and in which at least one of the length and width dimensions defining said area is at least two inches in length, comprising:

a thin self supporting metal framed flat rigid sheet of alumina for covering and hermetically sealing said confinement area;

the metal frame of said metal framed flat rigid sheet of alumina including a metal flange for supporting said flat rigid sheet of alumina on said package, said metal flange extending about and extending laterally outwardly from the periphery of said flat rigid sheet of alumina;

said thin self supporting metal framed flat rigid sheet of alumina being of a rigidity sufficient to prevent deflection of any surface portion thereof by more than 0.38 millimeters when the pressure differential between said confinement area and the exterior of said confinement area is one atmosphere.

4. A reworkable multi-chip module comprising:

a large multi-chip module package, said large multichip module package defining an internal region containing a plurality of semiconductor devices, said large multi-chip module package being open at an upper end to expose said internal region, said upper end defining an area of at least four square inches in which at least a length or width dimension to said area is at least two inches;

a stiff closure for closing said upper end of said large multi-chip module package to seal said internal region and confine said plurality of semiconductor devices, said stiff closure being of sufficient rigidity to withstand at least one atmosphere of differential pressure between said internal region and the exterior thereof without significant deflection, whereby posts are not required within said internal region to prevent significant deflection of said lid into said internal region into contact with any of said semiconductor devices; said stiff closure being removable from said module package in a single piece and being capable of reinstallation thereafter on said module package; said stiff closure including a panel of electrically non-conductive material and a flange of metal for supporting said panel upon said upper end of said module package, said flange bordering the periphery of said panel.

5. The invention as defined in claim 4, wherein said significant deflection comprises a deflection greater than 0.38 millimeters.

6. The invention as defined in claim 5, wherein said panel comprises a sheet of alumina of at least 0.04 inches in thickness.

7. A multi-chip module comprising:

a multi-chip module package, said multi-chip module package including a metal ring seal, having a upper edge and defining a hermetically sealed region of at least four square inches in size of which at least one linear dimension comprises at least two inches, and a plurality of semiconductor chips positioned within said region;

a lid for closing said region, said lid comprising:

a stiff self-supporting panel, said panel including upper and lower sides;

a metal flange having a thickness, said flange including upper and lower sides and having a peripheral edge surface on said upper side for framing and supporting said stiff panel; and said peripheral edge surface on said upper side including a layer of brazing material for bonding said peripheral edge surface of said flange to a peripheral edge of said lower side of said stiff panel;

said flange having a rim on said lower side for seating to said metal ring seal of said multi-chip module package; and said stiff panel being of a stiffness sufficient to prevent deflection of any surface portion of said panel by more than 0.38 millimeters when said upper and lower sides are subjected to a pressure differential of one atmosphere, whereby posts are not required within said region for support of said panel.

8. The invention as defined in claim 7, wherein said stiff panel comprises alumina.

9. The invention as defined in claim 8, wherein said stiff panel comprises a flat sheet of alumina, said sheet having a thickness of at least 0.04 inches.

* * * * *